(12) United States Patent
Yanagisawa et al.

(10) Patent No.: US 6,496,748 B1
(45) Date of Patent: Dec. 17, 2002

(54) WAFER FLATTENING PROCESS AND STORAGE MEDIUM

(75) Inventors: Michihiko Yanagisawa, Ayase (JP); Shinya Iida, Ayase (JP); Yasuhiro Horiike, 2-12, Higashifushimi 3-chome, Houya-shi, Tokyo (JP)

(73) Assignees: SpeedFam Co., Ltd., Tokyo (JP); Yasuhiro Horiike, Tokyo (JP)

( * ) Notice: Subject to any disclaimer, the term of this patent is extended or adjusted under 35 U.S.C. 154(b) by 0 days.

(21) Appl. No.: 09/234,937

(22) Filed: Jan. 21, 1999

(30) Foreign Application Priority Data

Mar. 10, 1998 (JP) ............................................ 10-076680

(51) Int. Cl.[7] ........................ G06F 19/00; H01L 21/316
(52) U.S. Cl. ........................... 700/121; 216/67; 216/38; 438/710
(58) Field of Search ........................ 700/121; 438/706, 438/707, 710, 719; 118/715, 728, 729; 216/38, 58, 63, 67, 79

(56) References Cited

U.S. PATENT DOCUMENTS 6,254,718 B1 * 7/2001 Tanaka et al. ............... 156/345
6,280,645 B1 * 8/2001 Yanagisawa et al. ......... 216/38
6,303,511 B2 * 10/2001 Yanagisawa ................ 438/710
6,360,687 B1 * 3/2002 Yanagisawa et al. ....... 118/723 MW

FOREIGN PATENT DOCUMENTS

JP         9-27482         1/1997

* cited by examiner

*Primary Examiner*—Paul P. Gordon
(74) *Attorney, Agent, or Firm*—Burr & Brown

(57) ABSTRACT

A wafer flattening process designed to flatten the entire surface of the wafer including the outer rim of the wafer by inserting dummy data corresponding to the data of the outer rim of the wafer in the data of the outside of the wafer, and a storage medium for the same. An area S is set at an outside position exactly an etching radius r from an outer rim Wc of the wafer Wc ahd the nozzle relative speed at the position-speed data D of points P4-1 to P4-3 closest to an imaginary line L passing through the point P4 inside the area S near the outer rim Wc is set to be the same as the nozzle relative speed of the position-speed data D of the point P4. Due to this, the nozzle spraying the activated species gas G moves as if along the imaginary line L and the portion of the point P4 is etched flat by superposition of the activated species gas G of the nozzle passing through the points P4-1 to P4-3, the point P4, and the point P6.

8 Claims, 7 Drawing Sheets

WAFER FLATTENING PROCESS AND STORAGE MEDIUM

BACKGROUND OF THE INVENTION

1. Field of the Invention

The present invention relates to a wafer flattening process for locally etching projecting portions on the surface of a wafer by an activated species gas to flatten the same or locally etching relatively thick portions of the wafer to make the distribution of thickness of the wafer uniform and to a storage medium for the same.

2. Description of the Related Art

FIG. 9 is a schematic sectional view of an example of a wafer flattening process of the related art.

In FIG. 9, reference numeral 100 is a plasma generator. The plasma generator 100 sprays the activated species gas G generated in the plasma from a nozzle 101 to the surface of the wafer W.

The wafer W is placed on and affixed to a stage 120. The stage 120 is made to move in the horizontal direction so as to guide the portion Wa relatively thicker than the prescribed thickness on the surface of the wafer W (hereinafter referred to as the "relatively thick portion") directly under the nozzle 101.

The activated species gas G is sprayed from the nozzle 101 to the projecting relatively thick portion Wa to locally etch the relatively thick portion Wa and make the distribution of thickness of the surface of the wafer W uniform.

The thickness of the relatively thick portion Wa of the wafer W however is also not uniform, but is diverse.

Therefore, technology has been devised for controlling the relative speed,of the nozzle 101 with respect to the wafer W in accordance with the thickness of the relatively thick portion Wa (for example, the technology described in Japanese Patent Laid-Open No. 9-2 7482).

This technology calls for the positions and thicknesses of the relatively thick portions Wa to be measured over the entire surface of the wafer W by a wafer flatness measuring device and for two-dimensional data of the positions and thicknesses to be prepared. The data is then converted to position-relative speed data showing the positions of the relatively thick portions Wa and the relative speed of the nozzle 101 by which the relatively thick portions Wa become the desired flatness after etching.

Next, the stage 120 is controlled based on this position-relative speed data to move the nozzle directly above the predetermined relatively thick portions Wa to etch the entire surface of the wafer W.

That is, at locations of relatively thick portions Wa with large thicknesses, the relative speed of the nozzle 101 is slowed to increase the amount of etching, while at locations of relatively thick portions Wa with small thicknesses, the relative speed of the nozzle 101 is increased to reduce the amount of etching, whereby the entire surface of the wafer W is flattened.

In the above wafer flattening process of the related art, however, there were the following problems.

FIG. 10 is a view of the state of spraying of the activated species gas G from the nozzle 101, FIG. 11 is a schematic view for explaining the flattening operation by superposition of the activated species gas G, and FIG. 12 is a schematic sectional view for explaining the problem in the wafer flattening process of the related art.

As shown in FIG. 10, the activated species gas G sprayed from the nozzle 101 spreads out as it heads downward. The portion of the wafer W directly beneath the nozzle 101 is therefore etched deeply, while the portions away from that are etched shallowly.

Accordingly, while the nozzle 101 is scanning the surface, as shown in FIG. 11, the area Wb of the wafer W starts to be etched by the activated species gas G sprayed from the nozzle 101 then heading toward the area Wb.

For example, assuming that the nozzle 101 moves from the left to the right in FIG. 11 and that the edge of the outskirt of the activated species gas G sprayed from the nozzle 101 reaching the position Q1 of the etching radius r from the left end of the area Wb contacts the edge of the area Wb, the area Wb is etched by the activated species gas G from the nozzle 101 moving from the position Q1 toward the position Q2 and is not affected by the activated species gas G at the pont of time when the nozzle 101 reaches the position Q2.

That is, the area Wb is etched by the superposition of the activated species gas G of the nozzle 101 moving between the positions Q1 to Q2. At this time, when the relatively thick portion of the area Wb is thick, the relative speed of the nozzle 101 moving between the positions Q1 and Q2 becomes slower in accordance with that thickness, while when the relatively thick portion of the area Wb is thin, the relative speed becomes faster, whereby the area Wb is etched flat.

With this wafer flattening process, however, there was the problem that the outer rim of the wafer W ended up being left thick.

That is, as shown in FIG. 12, when the nozzle 101 scans from the outside to the inside of the outer rim Wc, the nozzle 101 is moved at a high speed at the outside of the outer rim Wc and changes in relative speed in accordance with the thickness of the outer rim Wc when it reaches the position of the outer rim Wc, so the outer rim Wc is not affected much at all by the activated species gas G of the nozzle 101 when moving from the left. Therefore, when the outer rim is not the above relatively thick portion, there is not that much of a problem with the flattening of the outer rim, but when the outer rim is a relatively thick portion, the amount of etching of the outer rim is halved, the desired amount of etching is not achieved, and, as shown in FIG. 12, the area near the outer rim Wc ends up becoming remarkably thick compared with the inside portion of the wafer W.

SUMMARY OF THE INVENTION

The present invention was made to solve the above problems and has as its object to provide a wafer flattening process designed to flatten the entire surface of the wafer including the outer rim of the wafer by inserting dummy data corresponding to the data of the outer rim of the wafer in the data of the outside of the wafer and to provide a storage medium for the same.

To achieve the above object, according to a first aspect of the present invention, there is provided a wafer flattening process which causes a nozzle to scan the entire surface of a wafer based on position-speed data comprised of coordinates on a plane including the surface of the wafer and a nozzle relative speed set substantially inversely proportionally to the value of thickness of the wafer at those coordinates and flattens the wafer by activated species gas sprayed from the nozzle, the wafer flattening process comprising the steps of: using, as dummy data, position-speed data outside of a predetermined area set on the wafer closest to an imaginary line extending from the center of the wafer in the radial direction; and setting the nozzle relative speed of the dummy data to be substantially the same as the nozzle relative speed of the position-speed data of the outer rim of the above predetermined area and on the imaginary line.

Due to this configuration, when a nozzle is made to scan the entire surface of the wafer based on the position-speed data, the relative speed of the nozzle changes in a state substantially inversely proportional to the values of the thickness of the different portions of the wafer. At this time, since the nozzle, when at a position outside of the predetermined area closest to the imaginary line, scans the surface at substantially the same speed as the nozzle relative speed of the position-speed data at the outer rim of the predetermined area on the imaginary line due to the dummy data, the outer rim is etched like if by the activated species gas of the nozzle heading from the predetermined area along the imaginary line at the identical speed.

Depending on the wafer, it may be sufficient to flatten only a certain area in the inside at a high precision and may be not necessary to flatten the entire surface of the wafer at a high precision.

Therefore, in a preferred embodiment of the first aspect of the invention, the above predetermined area is a flatness quality area set at the inside of the wafer.

Alternatively, in another preferred embodiment of the first aspect of the invention, the above predetermined area is the entire area of the surface of the wafer.

Further, in a preferred embodiment of the first aspect of the invention and its embodiments, the dummy data exists only within a distance of about half of the etching diameter of the activated species gas from the outer rim of the predetermined area.

Due to this configuration, the nozzle relative speed becomes substantially the same as the nozzle relative speed set for the predetermined area only when the nozzle located at the outside of the predetermined area moves within a distance of about half of the etching diameter of the activated species gas from the outer rim of the predetermined area.

Note that the invention may also cover a storage medium storing the above position-speed data.

Therefore, according to a second aspect of the present invention, there is provided a storage medium storing position-speed data comprised of coordinates on a plane including the surface of the wafer and a nozzle relative speed set substantially inversely proportionally to the value of thickness of the wafer at those coordinates, wherein position-speed data outside of a predetermined area set on the wafer closest to an imaginary line extending from the center of the wafer in the radial direction is used as dummy data and the nozzle relative speed of the dummy data is set to be substantially the same as the nozzle relative speed of the position-speed data of the outer rim of the above predetermined area on the imaginary line.

In a preferred embodiment of the second aspect of the invention, the above predetermined area is a flatness quality area set at the inside of the wafer. Alternatively, the above predetermined area is the entire area of the surface of the wafer. Further, preferably the dummy data exists only within a distance of about half of the etching diameter of the activated species gas from the outer rim of the predetermined area.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Below, embodiments of the present invention will be explained with reference to the drawings.

Figure 1:
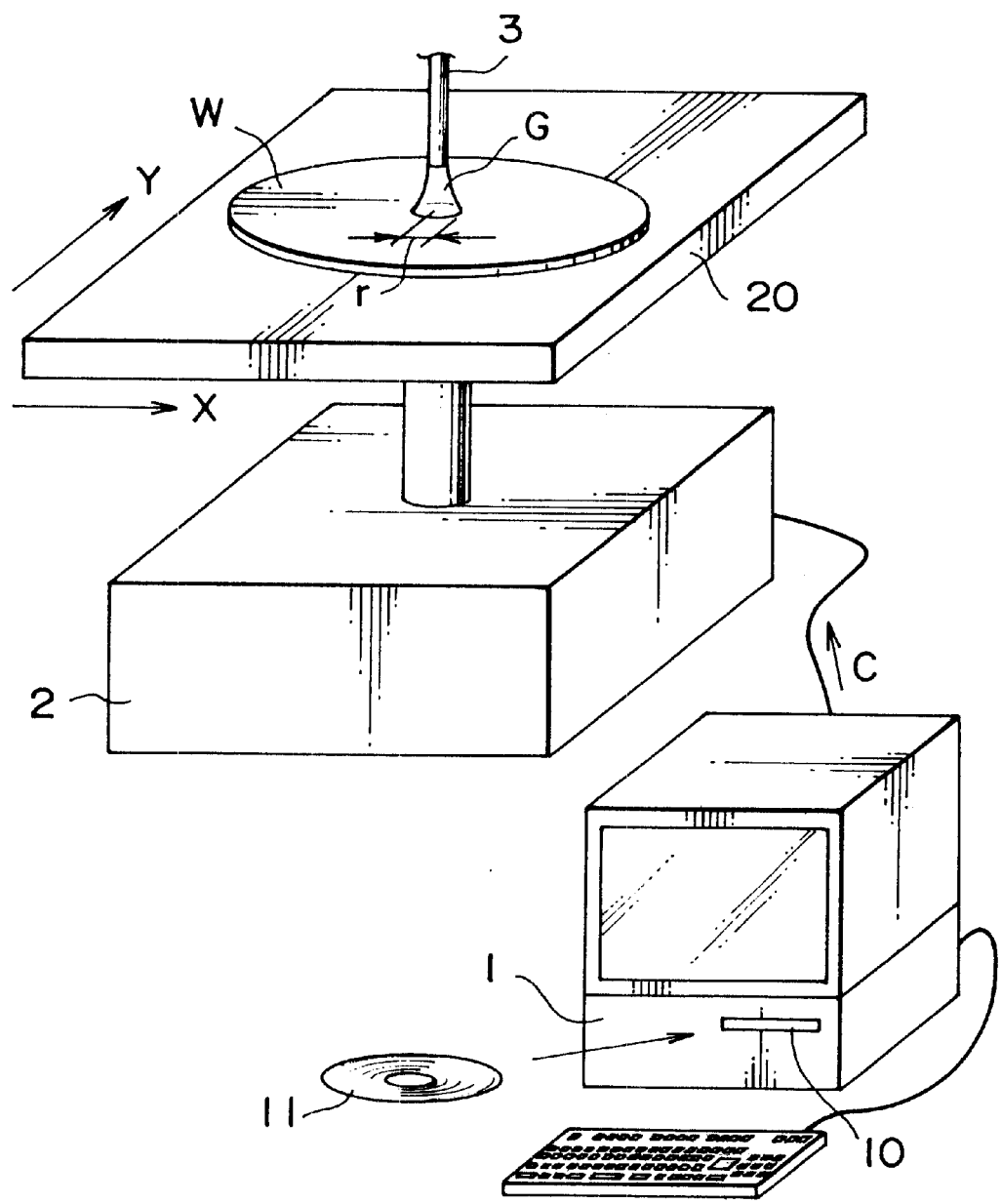
FIG. 1 is a schematic perspective view of an etching apparatus for working the wafer flattening process of the present invention.

FIG. 1 is a schematic perspective view of an etching apparatus for working the wafer flattening process of the present invention.

As shown in FIG. 1, the etching apparatus is provided with a computer 1, an X-Y drive mechanism 2 for making a stage 20 mounting a wafer W move horizontally under control of the computer 1, and a nozzle 3.

The computer 1 is provided with a CD-ROM drive 10 for driving a CD-ROM 11 serving as a storage medium and functions to output a control signal C to the X-Y drive mechanism 2 based on the position-speed data D in the CD-ROM 11.

The X-Y drive mechanism 2 is a mechanism for making the stage 20 move to a predetermined position at a predetermined speed based on the control signal C from the computer 1. That is, the X-Y drive mechanism 2 makes the nozzle 3 scan the wafer W at predetermined relative positions at a predetermined relative speed.

The nozzle 3 sprays activated species gas G generated by a not shown plasma generator toward the wafer W and is affixed at a predetermined location above the wafer W.

Due to this, the portion of the etching radius r of the wafer W positioned directly under the nozzle 3 is etched by the activated species gas G from the nozzle 3.

Here, a more detailed explanation will be given of the position-speed data D stored in the CD-ROM 11.

Figure 2:
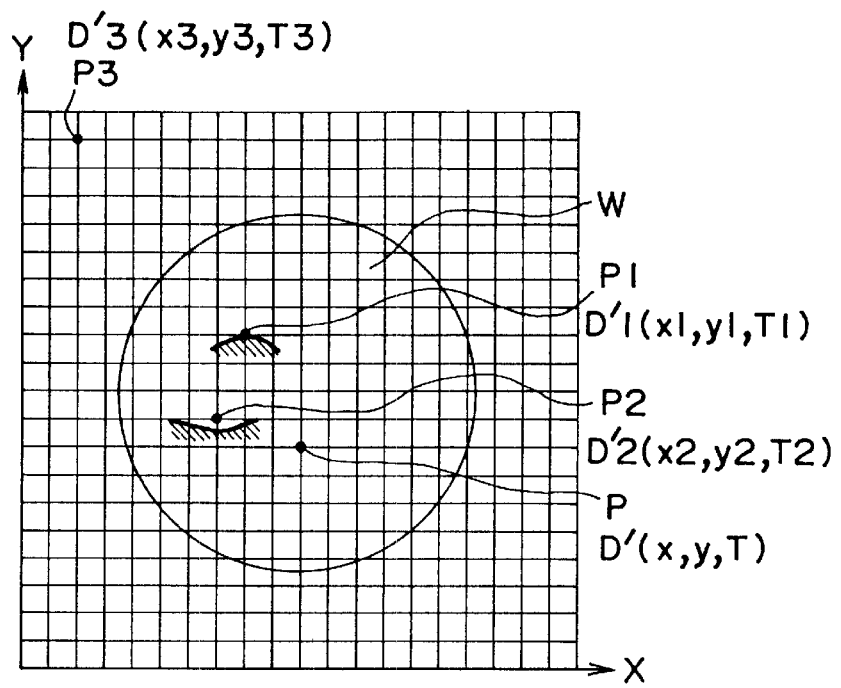
FIG. 2 is a plan view for explaining position-thickness data of a wafer.
Figure 3:
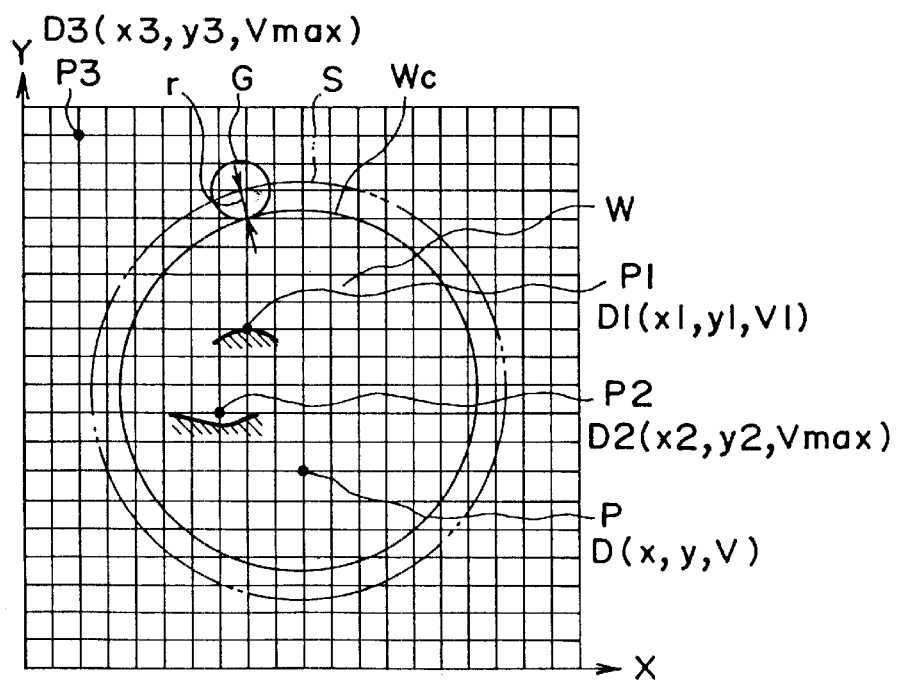
FIG. 3 is a plan view for explaining position-speed data.
Figure 4:
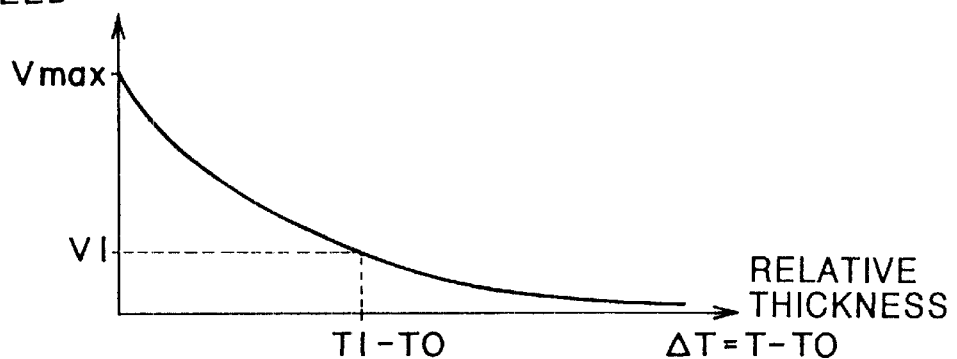
FIG. 4 is a graph of the relationship between the nozzle relative speed and the value of thickness of the wafer.

FIG. 2 is a plan view for explaining position-thickness data D' of a wafer W; FIG. 3 is a plan view for explaining position-speed data D; and FIG. 4 is a graph of the relationship between the relative speed of the nozzle 3 and the value of thickness of the wafer W. Note that in FIG. 2 and FIG. 3, the squares of the graph are drawn larger to facilitate understanding.

As shown in FIG. 2, the plane including the wafer W is divided into squares of about 1 mm to 2 mm size to form the X-Y coordinate system. The position-thickness data D' is comprised of the X-Y coordinates (x,y) of each point and the value of thickness T of the wafer W at each point.

As opposed to this, the position-speed data D is comprised of the data D(x,y,V) where the value of thickness T in the position-thickness data D' (x,y,T) is converted to a relative speed V of the nozzle 3 inversely proportional to the value of thickness T by a not shown converter.

For example, as shown in FIG. 2, when the value of thickness T1 of the position-thickness data D'1 at the point P1 of the coordinates (x1,y1) is greater than a certain reference value of thickness T0 (hereinafter this portion is called a "relatively thick portion"), the relative thickness $\Delta T=T1-T0$ is found, the value of thickness T1 is converted to the relative speed V1 of the position-speed data D1 of the point P1 based on the relation shown in FIG. 4, and the data of the point P1 is made D1(x1,y1,V1) as shown in FIG. 3. Further, as shown in FIG. 2, when the value of thickness T2 is less than the reference value of thickness T0 as shown by the position-thickness data D'2 at the point P2 of the coordinates (x2,y2), the relative speed is made the high speed Vmax and, as shown in FIG. 3, the data of the point P2 is made D2(x2,y2,Vmax).

Note however that as shown in FIG. 2, at the point P3 of the coordinates (x3,y3) outside of the wafer W, there is no wafer W, so the value of thickness T3 of the position-thickness data D'3 at that point P3 is for example made "0".

Accordingly, it is decided to make the relative speed of the position-speed data D3 of the point P3 the high speed Vmax.

As shown in FIG. 3, however, in the position-speed data D in the area S within the etching radius r from the outer rim Wc of the wafer W, the relative speed is not made the high speed Vmax uniformly such as with the position-speed data D3, but the relative speed is converted to correspond to the position-speed data D in the wafer W and at a point near the outer rim Wc.

Figure 5:
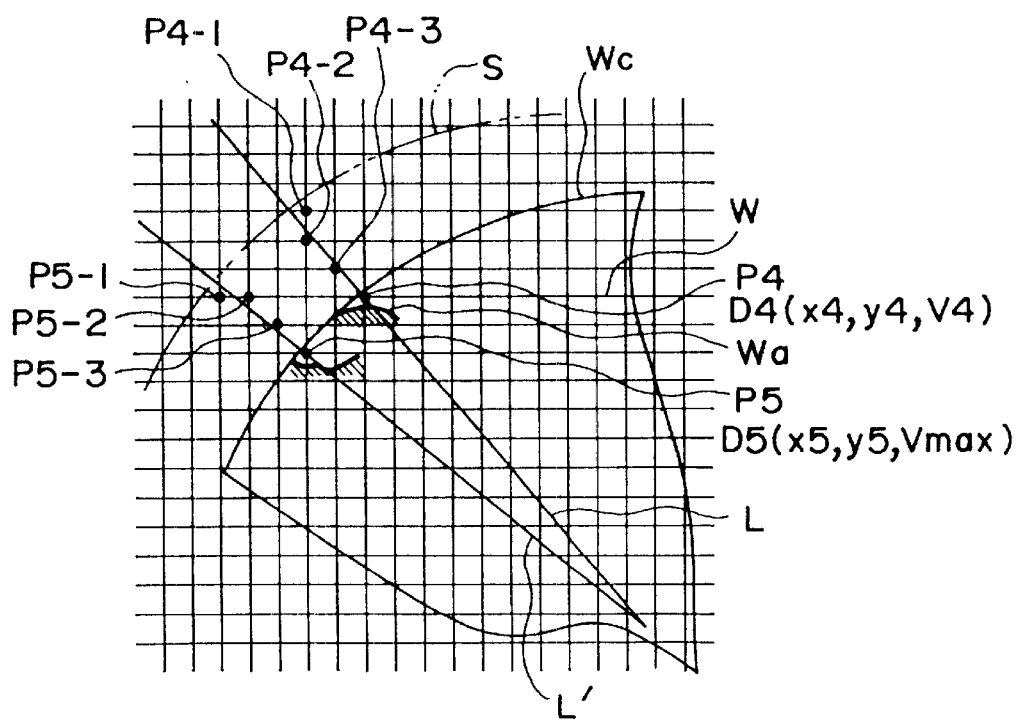
FIG. 5 is a plan view of the method of determination of the position-speed data inside a predetermined area.

FIG. 5 is a plan view of the method of determination of the position-speed data D inside the area S.

As shown in FIG. 5, when the portion of the point P4 positioned near the outer rim Wc of the wafer W (outer rim portion of the wafer W) is a relatively thick portion Wa, the position-speed data D4 at that point P4 is (x4,y4,V4) and the relative speed V4 is not Vmax. In this case, the imaginary line L extending from the center of the wafer W in the radial direction and passing through the point P4 is assumed and the relative speeds of the position-speed data D of the points P4-1 to P4-3 closest to the imaginary line L are all made the same as the relative speed V4 of the position-speed data D4.

Further, even when the portion is not a relatively thick portion as in the point P5, the relative speeds of the position-speed data D of the points P5-1 to P5-3 closest to the imaginary line L' passing through that point are made the same as the high speed Vmax of the position-speed data D5.

That is, the relative speed of the position-speed data D of a point near the outer rim Wc is copied to the position-speed data D of the points outside the outer rim Wc in the area S to set so-called dummy data for the area.

Next, an explanation will be given of the operation of the above etching apparatus.

Figure 6:
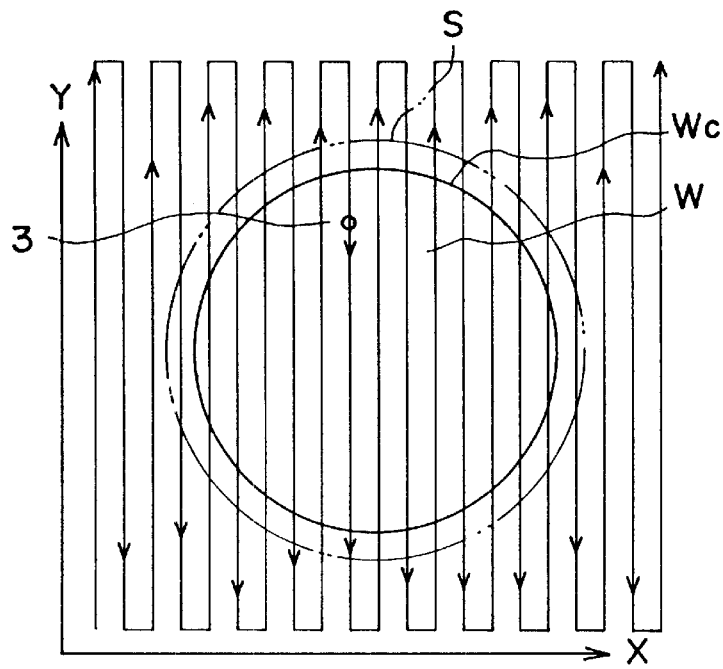
FIG. 6 is a plan view of the state of scanning by the nozzle.

FIG. 6 is a plan view of the state of scanning by the nozzle 3.

In FIG. 1, when the CD-ROM 11 is inserted into the CD-ROM drive 10 of the computer 1, the computer 1 reads the position-speed data D and outputs a control signal C corresponding to the position-speed data D of the different points to the X-Y drive mechanism 2.

This being done, the X-Y drive mechanism 2 makes the stage 20 move in the X-Y direction based on the control signal C and, as shown in FIG. 6, the nozzle 3 scans the X-Y plane in a zigzag manner.

The nozzle relative speed at the position-speed data D of the different points outside of the area S is the high speed Vmax, so the nozzle 3 enters a state moving at the high speed Vmax outside of the area S.

At the inner side of the wafer other than the outer rim, the relative speed V of the position-speed data D is set corresponding to the values of thickness T of the different points, so when passing over a relatively thick portion, the nozzle 3 moves slower corresponding to the thickness of the relatively thick portion, while when passing over a portion not a relatively thick portion, the nozzle 3 moves at the high speed Vmax.

These portions are subject to the effects of the activated species gas G of the nozzle 3 heading toward them, so are etched flat.

As opposed to this, when near the outer rim Wc, in the related art, the nozzle 3 moved uniformly at the high speed Vmax, so the outer rim was not etched flat.

In the wafer flattening process of this embodiment, however, as shown in FIG. 5, the nozzle relative speed of the position-speed data D of the different points in the area S closest to the imaginary line L passing through the points near the outer rim Wc is set to be the same as the nozzle relative speed of the position-speed data D of the points near the outer rim Wc and the position-speed data of the points is used as the dummy data, so the outer rim is subject to the effects of the activated species gas G of the nozzle 3.

For example, as shown in FIG. 5, the nozzle relative speed of the dummy data D of the points P4-1 to P4-3 corresponding to the point P4 of the relatively thick portion Wa is the "V4" of the position-speed data D of the point P4. Therefore, the nozzle 3 passes over the points P4-1 to P4-3, the point P4, and the point P6 by the nozzle relative speed V4.

Figure 7:
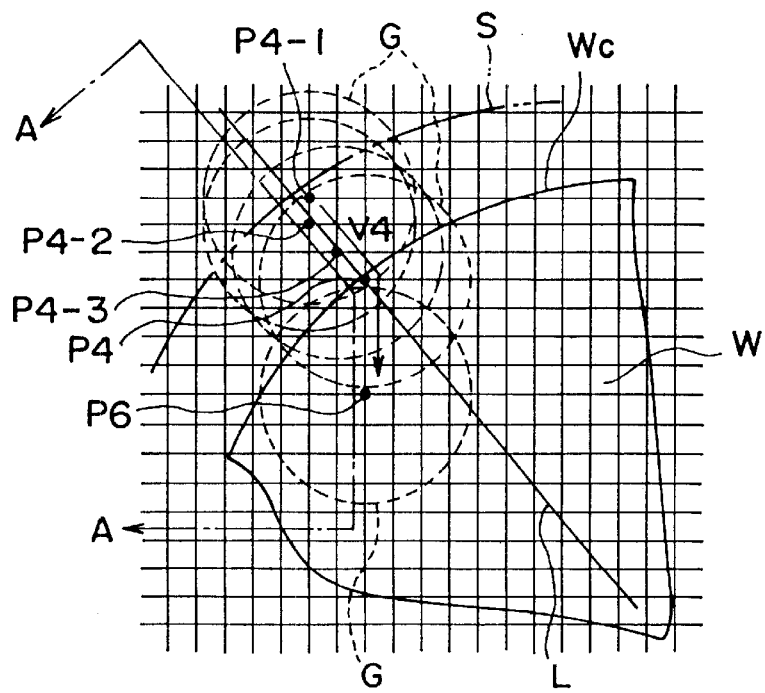
FIG. 7 is a plan view for explaining an etching operation of the outer rim of the wafer.
Figure 8:
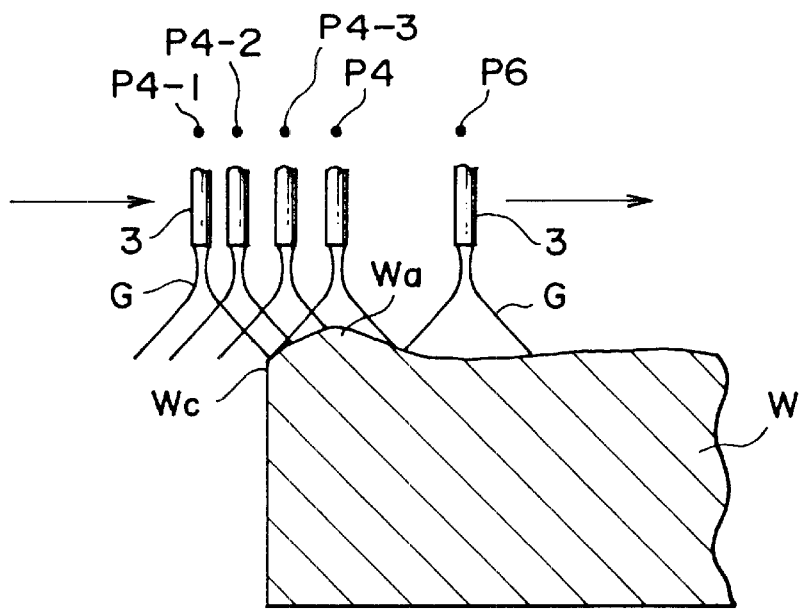
FIG. 8 is a sectional view taken along the line A—A of FIG. 7.
Figure 9:
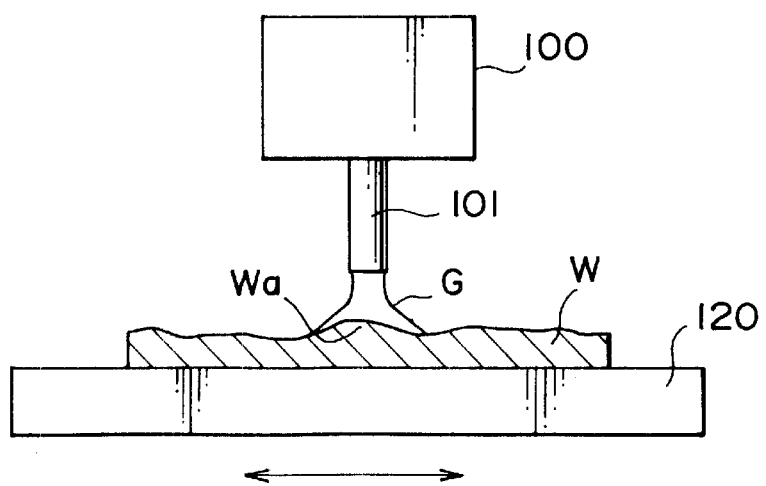
FIG. 9 is a schematic sectional view of an example of a wafer flattening process of the related art.
Figure 10:
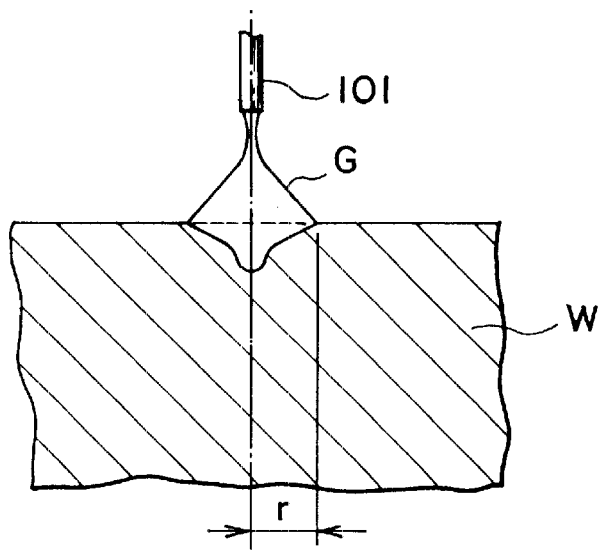
FIG. 10 is a view of the state of spraying of activated species gas from a nozzle.
Figure 11:
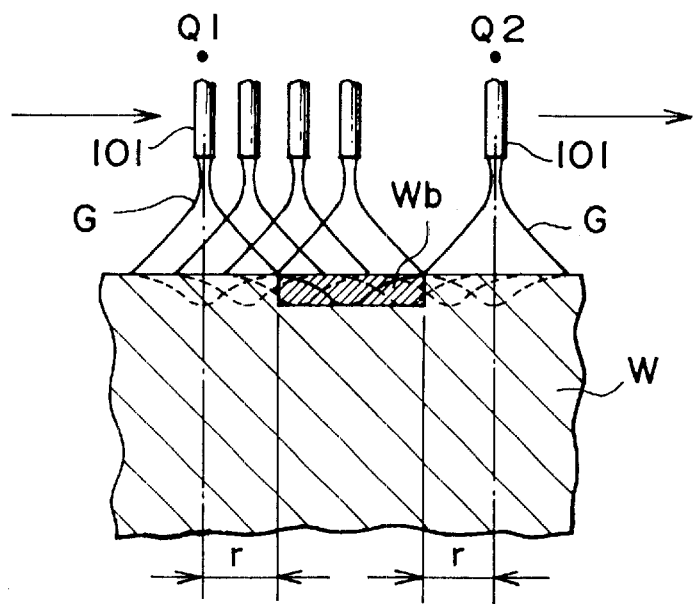
FIG. 11 is a schematic view for explaining a flattening operation by superposition of activated species gas.
Figure 12:
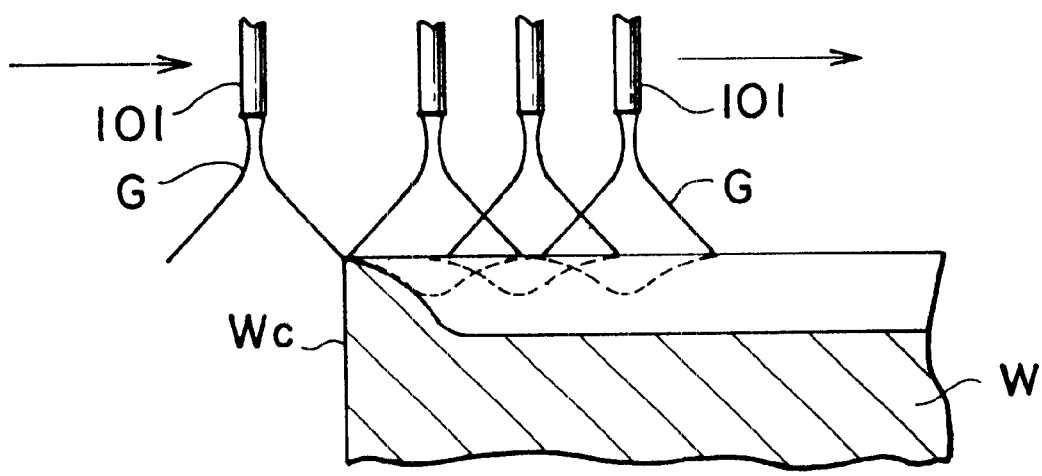
FIG. 12 is a schematic sectional view for explaining a problem in the wafer flattening process of the related art.

That is, as shown by FIG. 7 and FIG. 8, the relatively thick portion Wa of the point P4 is etched like by the effect of superposition of the activated species gas G of the nozzle 3 approaching along the imaginary line L at the relative speed V4 and the activated species gas G from the nozzle 3 passing through the point P4 and reaching the point P6 at the same speed. Therefore, the relatively thick portion Wa of the point P4 is etched in the same way as the relatively thick portion in the wafer W and similarly flattened.

Further, at the portions not relatively thick portions such as the point P5 shown in FIG. 5, the nozzle relative speed of the dummy data D of the points P5-1 to P5-3 near the imaginary line L' is set to the high speed Vmax, so the nozzle 3 approaches the point P5 along the imaginary line L' at the speed Vmax, then passes through it at the same speed, whereby etching is performed in the same way as at portions inside the wafer W not relatively thick portions.

In this way, according to the wafer flattening process of this embodiment, it becomes possible to flatten the entire surface of the wafer W including the outer rim of the wafer W and as a result it becomes possible to stably obtain a high quality wafer W with a TTV (total thickness variation) of not more than 0.2 $\mu$m.

Note that the present invention is not limited to the above embodiment and that various modifications and changes may be made within the scope of the invention.

For example, in the above embodiment, a CD-ROM was used as the storage medium for storing the position-speed data D, but of course it is also possible to store the position-speed data D in various other types of storage media such as floppy disks, minidiscs, digital video disks, hard disks, etc.

Further, in the above embodiment, the explanation was made of a process for flattening the entire surface of the wafer W, but it is sufficient to flatten just the flatness quality area inside the wafer W to a high precision in some cases. For such a wafer W, an area S extending from the outer rim of the flatness quality area by exactly the etching radius r is set and the nozzle relative speed of the position-speed data D in that area S is made the same as the nozzle relative speed of the position-speed data D of the outer rim in the same way as the above embodiment so as to flatten the entire flatness quality area to a high precision.

Further, while the nozzle relative speed of the position-speed data D of the points closest to the imaginary line L inside the area S was made the same as the nozzle relative speed of the position-speed data D of the wafer outer rim, the invention is not limited to within the area S. It is also possible to make the nozzle relative speed of the position-speed data D of all points closest to the imaginary line L outside of the outer rim Wc the same as the nozzle relative speed of the position-speed data D of the outer rim.

As explained above in detail, according to the first and second aspects of the present invention, the outer rim of a predetermined area is subject to effects like that of activated species gas from a nozzle heading from the outside along an imaginary line at a nozzle relative speed set for that outer rim, so there is the advantageous effect that the outer rim can be flattened in the same way as the inside of the predetermined area.

Further, according to first preferred embodiments of the first and second aspects of the present invention, it is possible to flatten just the flatness quality area to a high precision.

Further, according to second preferred embodiments of the first and second aspects of the present invention, it is possible to reliably flatten the entire surface of the wafer.

According to third preferred embodiments of the first and second aspects of the invention, the nozzle relative speed becomes substantially the same as the nozzle relative speed set for the predetermined area only when the nozzle located at the outside of the predetermined area moves within a distance of about half of the etching diameter of the activated species gas from the outer rim of the predetermined area.

What is claimed is:

1. A wafer flattening process which causes a nozzle to scan the entire surface of a wafer based on position-speed data comprised of coordinates on a plane including the surface of the wafer and a nozzle relative speed set substantially inversely proportionally to the value of thickness of the wafer at those coordinates and flattens the wafer by activated species gas sprayed from the nozzle, said wafer flattening process comprising the steps of:

using, as dummy data, position-speed data outside of a predetermined area set on the wafer closest to an imaginary line extending from the center of the wafer in the radial direction; and setting the nozzle relative speed of the dummy data to be substantially the same as the nozzle relative speed of the position-speed data of the outer rim of the above predetermined area on the imaginary line.

2. A wafer flattening process as set forth in claim 1, wherein the above predetermined area is a flatness quality area set at the inside of the wafer.

3. A wafer flattening process as set forth in claim 1, wherein the above predetermined area is the entire area of the surface of the wafer.

4. A wafer flattening process as set forth in claim 1, wherein the dummy data exists only within a distance of about half of an etching diameter of the activated species gas from the outer rim of the predetermined area.

5. A storage medium storing position-speed data comprised of coordinates on a plane including the surface of the wafer and a nozzle relative speed set substantially inversely proportionally to the value of thickness of the wafer at those coordinates, wherein position-speed data outside of a predetermined area set on the wafer closest to-an imaginary line extending from the center of the wafer in the radial direction is used as dummy data, and the nozzle relative speed of the dummy data is set to be substantially the same as the nozzle relative speed of the position-speed data of the outer rim of the above predetermined area on the imaginary line.

6. A storage medium as set forth in claim 5, wherein the above predetermined area is a flatness quality area set at the inside of the wafer.

7. A storage medium as set forth in claim 5, wherein the above predetermined area is the entire area of the surface of the wafer.

8. A storage medium as set forth in claim 5, wherein the dummy data exists only within a distance of about half of an etching diameter of an activated species gas from the outer rim of the predetermined area.

* * * * *